(12) United States Patent
Liu et al.

(10) Patent No.: US 10,944,022 B2
(45) Date of Patent: Mar. 9, 2021

(54) SOLAR CELL WITH DELTA DOPING LAYER

(71) Applicant: The Boeing Company, Chicago, IL (US)

(72) Inventors: Xing-Quan Liu, Arcadia, CA (US); Christopher M. Fetzer, Valencia, CA (US); Daniel C. Law, Arcadia, CA (US)

(73) Assignee: The Boeing Company, Chicago, IL (US)

( * ) Notice: Subject to any disclaimer, the term of this patent is extended or adjusted under 35 U.S.C. 154(b) by 189 days.

(21) Appl. No.: 14/862,394

(22) Filed: Sep. 23, 2015

(65) Prior Publication Data

US 2016/0013357 A1    Jan. 14, 2016

Related U.S. Application Data

(62) Division of application No. 13/407,924, filed on Feb. 29, 2012, now Pat. No. 9,178,098.

(51) Int. Cl.
*H01L 31/18* (2006.01)
*H01L 31/0735* (2012.01)
*H01L 31/0304* (2006.01)
*H01L 31/0687* (2012.01)
*H01L 31/0693* (2012.01)

(52) U.S. Cl.
CPC ...... *H01L 31/1844* (2013.01); *H01L 31/0735* (2013.01); *H01L 31/0304* (2013.01); *H01L 31/03042* (2013.01); *H01L 31/0687* (2013.01); *H01L 31/0693* (2013.01); *Y02E 10/544* (2013.01)

(58) Field of Classification Search
CPC .. H01L 31/18; H01L 31/1804; H01L 31/1852
See application file for complete search history.

(56) References Cited

U.S. PATENT DOCUMENTS

| | | | | |
|---|---|---|---|---|
| 4,524,237 A | * | 6/1985 | Ross | H01L 31/0312 |
| | | | | 136/255 |
| 5,019,177 A | * | 5/1991 | Wanlass | H01L 31/03046 |
| | | | | 117/89 |
| 5,935,345 A | * | 8/1999 | Kuznicki | H01L 31/068 |
| | | | | 136/255 |

(Continued)

FOREIGN PATENT DOCUMENTS

| | | |
|---|---|---|
| JP | 08-116073 | 5/1996 |
| JP | 09-082995 | 3/1997 |

(Continued)

OTHER PUBLICATIONS

Kurita, H. et al.; High-Efficiency Monolithic InGaP/GaAs Tandem Solar Cells with improved Top-Cell Back-Surface-Field Layers; May 13, 1995; Seventh International conference on Indium Phosphide and Related Materials; Conference proceedings; pp. 516-519.*

(Continued)

*Primary Examiner* — Edward J. Schmiedel
(74) *Attorney, Agent, or Firm* — Walters & Wasylyna LLC

(57) ABSTRACT

A solar cell including a base region, a back surface field layer and a delta doping layer positioned between the base region and the back surface field layer.

20 Claims, 4 Drawing Sheets

(56) References Cited

U.S. PATENT DOCUMENTS

| | | | |
|---|---|---|---|
| 6,265,652 B1* | 7/2001 | Kurata | H01L 31/022466 136/244 |
| 2003/0070707 A1* | 4/2003 | King | H01L 31/02168 136/255 |
| 2004/0065363 A1* | 4/2004 | Fetzer | H01L 21/02543 136/262 |
| 2005/0062041 A1* | 3/2005 | Terakawa | H01L 31/0747 257/53 |
| 2006/0255340 A1 | 11/2006 | Manivannan et al. | |
| 2009/0145476 A1* | 6/2009 | Fetzer | H01L 31/184 136/256 |
| 2009/0272423 A1* | 11/2009 | Niira | H01L 31/076 136/244 |
| 2010/0116327 A1* | 5/2010 | Cornfeld | H01L 31/078 136/255 |
| 2010/0139763 A1 | 6/2010 | Van Nieuwenhuysen et al. | |
| 2013/0344645 A1* | 12/2013 | Ahmari | H01L 31/0336 438/94 |

FOREIGN PATENT DOCUMENTS

| | | |
|---|---|---|
| JP | 09-283778 | 10/1997 |
| JP | 2001-085718 | 3/2001 |
| JP | 3 250425 B2 | 1/2002 |
| JP | 2006-237111 A | 9/2006 |
| JP | 2006-319335 A | 11/2006 |
| WO | 2010/107522 A1 | 9/2010 |

OTHER PUBLICATIONS

Kazama, Yoshiyuki, et al.; High Efficiency Amorphous Silicon Solar Cells with "Delta-Doped" P-layer; Japanese Journal of Applied Physics; vol. 28, No. 7, Jul. 1989, pp. 1160-1164 (Year: 1989).*
DeSalvo, Gregory C.; Ultrathin delta doped GaAs and AlAs tunnel junctions as interdevice ohmic contacts; Journal of Applied Physics 74, 4207 (1993); pp. 4207-4212 (Year: 1993).*
State Intellectual Property Office of PRC, First Official Action, App. No. 201310048511.6 (dated 2016).
State Intellectual Property Office of PRC, English Translation of First Official Action, App. No. 201310048511.6 (dated 2016).
Japanese Patent Office, Notice of Rejection, App. No. 2013-038097 (dated Jan. 29, 2017).
European Patent Office, Extended European Search Report, EP 13 15 4715 (dated Aug. 9, 2017).
Japanese Patent Office, Notice of Reasons of Rejection (and translation thereof), JP 2013-038097 (dated Sep. 26, 2017).
Taiwan Intellectual Property Office, Preliminary Examination Report (and translation thereof), Taiwan Patent Application No. 106117175 (dated Oct. 3, 2017).

* cited by examiner

SOLAR CELL WITH DELTA DOPING LAYER

PRIORITY

This application is a divisional of, and claims priority from, U.S. Ser. No. 13/407,924 filed on Feb. 29, 2012, the entire contents of which are incorporated herein by reference.

FIELD

This application relates to solar cells and, more particularly, to solar cells with a delta doping layer and, even more particularly, to solar cells with a delta doping layer in the back surface field region.

BACKGROUND

Solar cells convert the sun's energy into useful electrical energy by way of the photovoltaic effect. Modern multi-junction solar cells operate at efficiencies significantly higher than traditional, silicon solar cells, with the added advantage of being lightweight. Therefore, solar cells provide a reliable, lightweight and sustainable source of electrical energy suitable for a variety of terrestrial and space applications.

A solar cell typically includes a semiconductor material having a certain energy bandgap. Photons in sunlight having energy greater than the bandgap of the semiconductor material are absorbed by the semiconductor material, thereby freeing electrons within the semiconductor material. The freed electrons diffuse through the semiconductor material and flow through a circuit as an electric current.

Electron-hole recombination at the rear surface of a solar cell results in a loss of efficiency. Therefore, solar cells are typically provided with a back surface field layer positioned proximate the rear surface of the solar cell. The back surface field layer serves as a barrier to minority carrier flow toward the rear surface (i.e., toward the tunnel junction or the rear electrode). Therefore, the back surface field layer generally prevents the minority carrier from recombining at the back interface or surface, or escaping out of the base, of the solar cell, thereby passivating the base back interface or surface and acting as a minority carrier barrier of the solar cell. Unfortunately, it is becoming increasingly difficult to find higher bandgap material to use as the back surface field layer, particularly for high bandgap solar cells, such as AlGaInP solar cells.

Accordingly, those skilled in the art continue with research and development efforts in the field of solar cells.

SUMMARY

In one embodiment, the disclosed solar cell may include a base region, a back surface field layer and a delta doping layer positioned between the base region and the back surface field layer.

In another embodiment, the disclosed solar cell may include a base region having a front end and a rear end, and a delta doping layer positioned proximate the rear end of the base region.

In yet another embodiment, disclosed is a method for forming a solar cell. The method may include the steps of (1) providing a substrate; (2) growing a back surface field layer on the substrate; (3) delta doping the back surface field layer to form a delta doping layer; and (4) growing an additional layer over the delta doping layer.

Other embodiments of the disclosed solar cell with delta doping layer and method for forming the same will become apparent from the following detailed description, the accompanying drawings and the appended claims.

DETAILED DESCRIPTION

Figure 1:
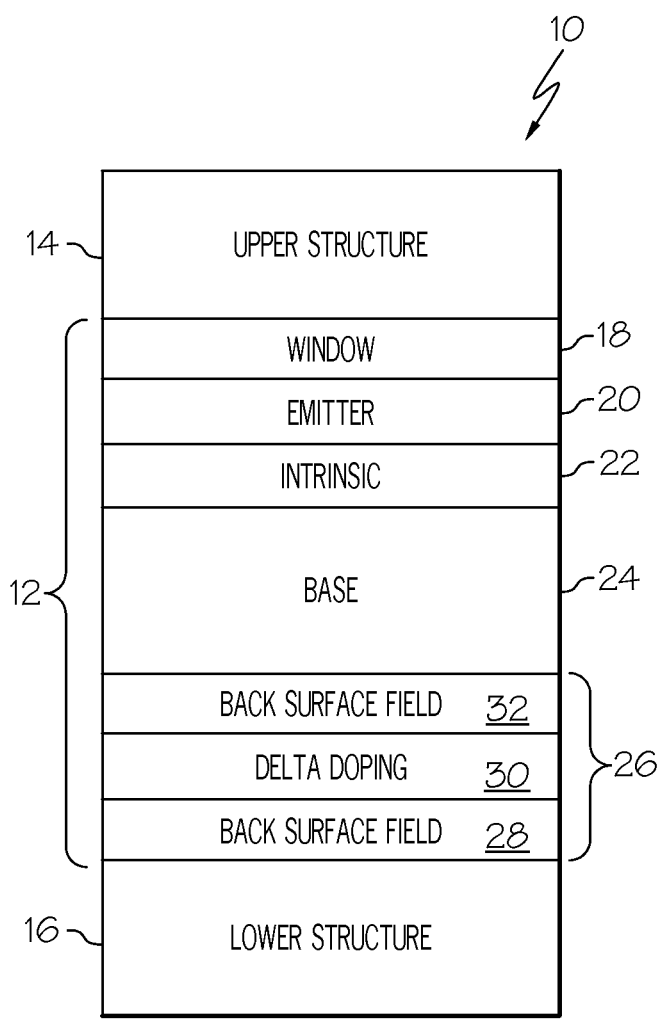
FIG. 1 is a schematic cross-sectional view of one embodiment of the disclosed solar cell with delta doping layer.

Referring to FIG. 1, one embodiment of the disclosed solar cell with delta doping layer, generally designated 10, may include a cell 12 positioned between an upper structure 14 and a lower structure 16. The cell 12 may include a window 18, an emitter region 20, an intrinsic or depletion region 22, a base region 24 and a back surface field ("BSF") region 26.

The upper structure 14 may be any structure positioned over the cell 12. Those skilled in the art will appreciate that the specific composition of the upper structure 14 will depend on the specific construction of the solar cell 10.

In one construction, the solar cell 10 may be a multijunction solar cell and the cell 12 may be the upper subcell of the multijunction solar cell. Alternatively, the cell 12 may be the only cell of the solar cell 10. Therefore, the upper structure 14 may include, for example, an anti-reflective coating layer, a cap layer (e.g., a GaAs cap) and an electrical contact layer (e.g., a metal grid).

In another construction, the solar cell 10 may be a multijunction solar cell and the upper structure 14 may be another subcell of the multijunction solar. Those skilled in the art will appreciate that adjacent subcells may be separated by a tunnel junction.

The lower structure 16 may be any structure positioned below the cell 12. Those skilled in the art will appreciate that the specific composition of the lower structure 16 will depend on the specific construction of the solar cell 10.

In one construction, the solar cell 10 may be a multijunction solar cell and the cell 12 may be the lower subcell of the multijunction solar cell. Alternatively, the cell 12 may be the only cell of the solar cell 10. Therefore, the lower structure 16 may include, for example, a buffer layer and a substrate (e.g., a germanium substrate).

In another construction, the solar cell 10 may be a multijunction solar cell and the lower structure 16 may be another subcell of the multijunction solar. Cell 12 may be separated from the underlying cell by a tunnel junction.

The back surface field region 26 may include a first back surface field layer 28, a delta doping layer 30 and a second back surface field layer 32. Therefore, the delta doping layer 30 may be positioned between the first back surface field layer 28 and the second back surface field layer 32.

Alternatively, the back surface field region 26 may include the first back surface field layer 28 and the delta doping layer 30 (i.e., no second back surface field layer). Therefore, the the delta doping layer 30 may be positioned at the interface between the base region 24 and the first back surface field layer 28.

The delta doping layer 30 may be comprised of any element that behaves as a dopant with respect to the first and second back surface field layers 28, 32. Therefore, the composition of the delta doping layer 30 may depend on the composition of the first and second back surface field layers 28, 32.

As one general and non-limiting example, the cell 12 may be formed as follows: the window 18 may be AlInP$_2$, the emitter region 20 may be GaInP$_2$, the intrinsic region 22 may be GaInP$_2$, the base region 24 may be GaInP$_2$, and the first and second back surface field layers 28, 32 may be AlGaAs. Therefore, since the first and second back surface field layers 28, 32 are formed from Group 13 and 15 elements, the delta doping layer 30 may be formed from an element (or elements) other than the elements in Groups 13 and 15.

As one specific and non-limiting example, the first and second back surface field layers 28, 32 of the cell 12 may be formed from AlGaAs and the delta doping layer 30 may be formed from a Group 14 element, such as carbon, silicon or germanium.

As another specific and non-limiting example, the first and second back surface field layers 28, 32 of the cell 12 may be formed from AlGaAs and the delta doping layer 30 may be formed from carbon.

The layer thickness of the delta doping layer 30 may depend on various factors, including the type of delta dopant used and the back surface field material (e.g., the material of the first back surface field layer 28) upon which the delta doping layer 30 is applied. Those skilled in the art will appreciate that the limitations of delta doping may limit the overall layer thickness of the delta doping layer 30 that may be achieved.

In one expression, the delta doping layer 30 may have an average layer thickness ranging from about 1 nanometer to about 100 nanometers. In another expression, the delta doping layer 30 may have an average layer thickness ranging from about 5 nanometers to about 50 nanometers. In another expression, the delta doping layer 30 may have an average layer thickness ranging from about 5 nanometers to about 25 nanometers. In another expression, the delta doping layer 30 may have an average layer thickness ranging from about 5 nanometers to about 15 nanometers. In yet another expression, the delta doping layer 30 may have an average layer thickness of about 10 nanometers.

Thus, the delta dopant may be confined to a very thin layer in the back surface field region 26.

The bulk concentration of delta dopant in the delta doping layer 30 may also depend on various factors, including the type of delta dopant used and the material of the substrate (e.g., the material of the first back surface field layer 28) upon which the delta doping layer 30 is applied.

In one expression, the bulk concentration of delta dopant in the delta doping layer 30 may be at least about $1 \times 10^{18}$ atoms per cm$^3$. In another expression, the bulk concentration of delta dopant in the delta doping layer 30 may be at least about $1 \times 10^{19}$ atoms per cm$^3$. In another expression, the bulk concentration of delta dopant in the delta doping layer 30 may be at least about $1 \times 10^{20}$ atoms per cm$^3$. In another expression, the bulk concentration of delta dopant in the delta doping layer 30 may be at least about $1 \times 10^{21}$ atoms per cm$^3$. In yet another expression, the bulk concentration of delta dopant in the delta doping layer 30 may range from about $1 \times 10^{18}$ atoms per cm$^3$ to about $1 \times 10^{22}$ atoms per cm$^3$.

Figure 2:
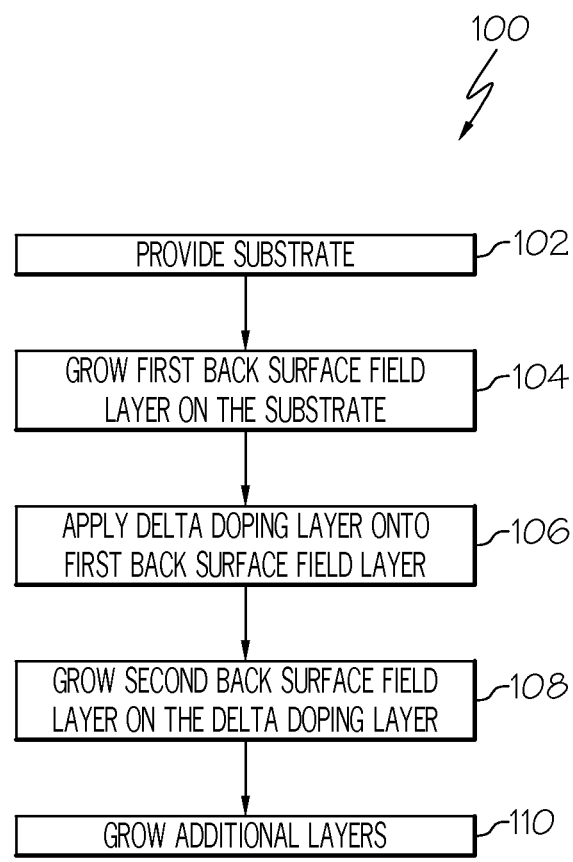
FIG. 2 is a flow chart showing the steps that may be used to form the disclosed solar cell with delta doping layer.

FIG. 2 is a flow chart that depicts the steps of one particular aspect of the disclosed method, generally designated 100, for forming the disclosed solar cell with delta doping layer. Other methods for forming a delta doping layer proximate the rear of a solar cell are also contemplated.

The method 100 may begin at block 102 with the step of providing a suitable substrate. The substrate may be any substrate upon which a back surface field layer may be grown. One non-limiting example of a suitable substrate is germanium.

At block 104, a first back surface field layer may be grown on the substrate. The step of growing the first back surface field layer (step 104) may continue until the desired cross-sectional thickness of the first back surface field layer has been achieved.

The first back surface field layer may be grown by epitaxy, such as molecular beam epitaxy, metalorganic vapor-phase epitaxy or chemical vapor-phase epitaxy. The epitaxy precursors may be selected to yield the desired material of the first back surface field layer.

Optionally, prior to the step (block 104) of growing the first back surface field layer, a buffer may be applied to the substrate such that the buffer is positioned between the first back surface field layer and the substrate. Those skilled in the art will appreciate that a buffer may be selected to minimize or eliminate the effects of lattice mismatch between the first back surface field layer and the substrate.

At block 106, epitaxy may be halted and delta doping may begin. During the delta doping step (block 106), the desired delta dopant may be introduced to form a delta doping layer on the first back surface field layer. The delta doping step (block 106) may be performed until a predetermined minimum bulk concentration of the delta dopant in the delta doping layer has been achieved.

At block 108, delta doping may be halted and growth of the second back surface field layer may begin. The second back surface field layer may be grown by epitaxy until the desired cross-sectional thickness of the second back surface field layer has been achieved.

With the back surface field layers and the delta doping layer formed, the method 100 may continue with the step of growing additional layers of the solar cell, such as the base region, the intrinsic region, the emitter region and the window 18, as shown at block 110.

Figure 3:
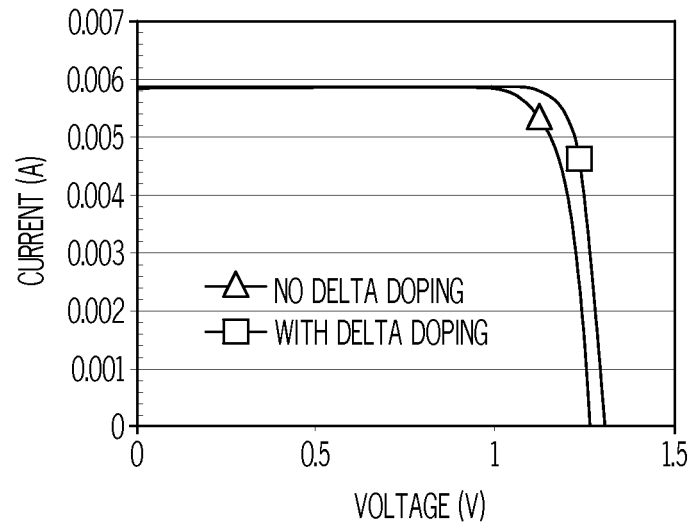
FIG. 3 is a graphical illustration of illuminated current-voltage ("LIV") comparing the disclosed solar cell (with a delta doping layer) and a solar cell without a delta doping layer in the back surface field region.
Figure 4:
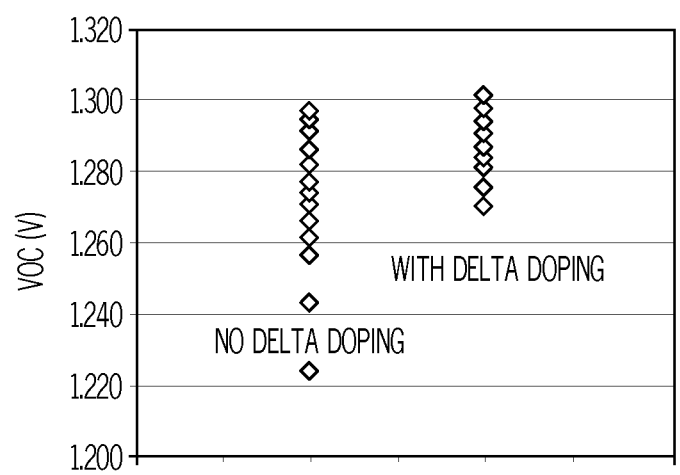
FIG. 4 is a graphical illustration of open-circuit voltage of the disclosed solar cell (with a delta doping layer) and, for comparison, a solar cell without a delta doping layer in the back surface field region.

Thus, two solar cells were assembled using the method 100: one with a delta doping layer in the back surface field region and one without a delta doping layer. Both solar cells were generally identical other than either the presence or absence of the delta doping layer. As shown in FIGS. 3 and 4, the solar cell with a delta doping layer exhibits higher open circuit voltage ("Voc") and a better fill factor.

Figure 5A:
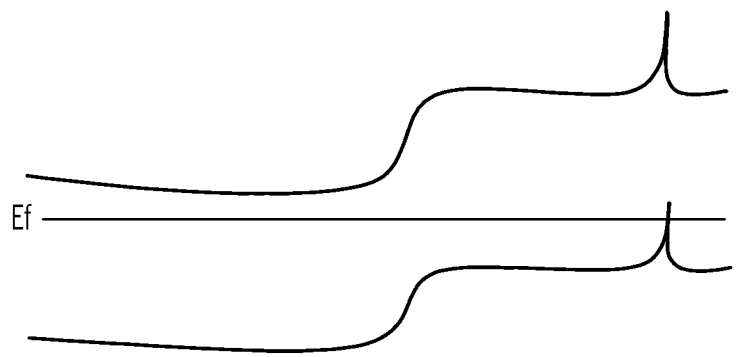
FIG. 5A is a schematic bandgap diagram of a solar cell having a delta doping layer alone as the back surface field region.
Figure 5B:
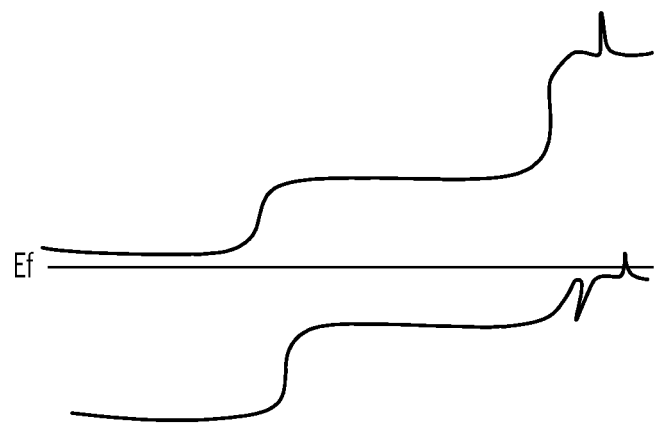
FIG. 5B is a schematic bandgap diagram of a solar cell having a delta doping layer as part of the back surface field region.

FIGS. 5A and 5B are schematic band diagrams of two solar cells with delta doping as part the back surface field region. FIG. 5A is the band diagram of a solar cell in which the delta doping layer is the only back surface field layer. FIG. 5B is the band diagram of a solar cell in which the delta doping layer is in addition to the higher bandgap back surface field layer. In FIG. 5A, the delta doping layer introduces a band energy spike, and this energy spike blocks the minority carrier from escaping away from the p-n junction. In FIG. 5B, the delta doping layer-induced energy spike reinforces the back surface field function of blocking the minority carrier.

When the delta doping layer is positioned at the interface of the base region and the back surface field layer, the delta doping layer may passivate better at the interface and, therefore, may reduce the interface recombination, which may also improve the back surface field function.

Furthermore, by positioning the delta doping layer in the back surface field region, the highly p-type delta doping layer may be very well confined in a narrow material thickness range such that p-dopant back-diffusion into the base region is of little or no concern. Those skilled in the art will appreciate that diffusion of dopant into the base region can hurt cell performance by shortening the minority carrier diffusion length.

Accordingly, solar cell efficiency may be improved by using a delta doping layer in the back surface field region of the solar cell. Without being limited to any particular theory, it is believed that using a delta doping layer in the back surface field region may render the back surface field region more efficient at blocking the minority carrier in the solar cell base and may passivate better at the interface between the base region and the back surface field region. It is further believed that using a delta doping layer in the back surface field region may be particularly useful for high bandgap solar cells in which it is hard to find a higher bandgap material to use as the back surface field.

In another, alternative embodiment, the disclosed delta doping layer may be incorporated into the base region, rather than the back surface field region, of the solar cell. The base region may include a front end and a rear end. The delta doping layer may be incorporated into the base region proximate (i.e., at or near) the rear end of the base region.

Although various embodiments of the disclosed solar cell with delta doping layer have been shown and described, modifications may occur to those skilled in the art upon reading the specification. The present application includes such modifications and is limited only by the scope of the claims.

What is claimed is:

1. A method for manufacturing a solar cell comprising:
   growing a first back surface field layer on a substrate;
   delta doping said first back surface field layer to form a delta doping layer;
   growing a second back surface field layer over said delta doping layer, wherein said delta doping layer is in direct contact with both said first back surface field layer and said second back surface field layer; and
   growing a plurality of additional layers over said second back surface field layer to yield said solar cell having a front portion corresponding to a light-receiving surface and a rear portion opposed from said front portion, said plurality of additional layers comprising:
   a window at said front portion of said solar cell;
   a base region adjacent said second back surface field layer; and
   an emitter region between said base region and said window,
   wherein said first back surface field layer, said delta doping layer, and said second back surface field layer define a back surface field region at said rear portion of said solar cell, wherein said first back surface field layer, said delta doping layer, and said second back surface field layer have a higher bandgap than said base region.

2. The method of claim 1 wherein said growing said first back surface field layer comprises growing by epitaxy.

3. The method of claim 2 wherein said growing by epitaxy comprises at least one of molecular beam epitaxy, metalorganic vapor-phase epitaxy and chemical vapor-phase epitaxy.

4. The method of claim 1 wherein said first back surface field layer comprises AlGaAs or AlGaInP.

5. The method of claim 4 wherein said delta doping layer comprises at least one of carbon, silicon, germanium, tin and lead.

6. The method of claim 1 wherein said delta doping layer has an average layer thickness of at least 1 nanometer.

7. The method of claim 1 wherein said delta doping layer has an average layer thickness ranging from about 5 nanometers to about 15 nanometers.

8. The method of claim 1 wherein said delta doping layer comprises dopant at a concentration of at least $1 \times 10^{18}$ atoms per $cm^3$.

9. The method of claim 1 wherein said delta doping layer comprises dopant at a concentration of at least $1 \times 10^{19}$ atoms per $cm^3$.

10. The method of claim 1 wherein said delta doping layer comprises dopant at a concentration of at least $1 \times 10^{20}$ atoms per $cm^3$.

11. The method of claim 1 further comprising applying a buffer to said substrate prior to said growing said first back surface field layer.

12. The method of claim 1 wherein said plurality of additional layers further comprises an intrinsic region between said base region and said emitter region.

13. The method of claim 1 wherein said growing said plurality of additional layers comprises growing by epitaxy.

14. The method of claim 1 wherein said growing said second back surface field layer comprises growing by epitaxy.

15. The method of claim 1 wherein both said first back surface field layer and said second back surface field layer comprise AlGaAs.

16. The method of claim 1 wherein the solar cell comprises a first subcell, the first subcell comprising said first back surface field layer, said delta doping layer, said second back surface field layer and said plurality of additional layers said method further comprising assembling a second subcell proximate said back surface field region of said first subcell.

17. A method for manufacturing a solar cell comprising the steps of:
   growing a back surface field layer on a substrate, said back surface field layer comprising AlGaAs or AlGaInP;
   delta doping said back surface field layer to form a delta doping layer, said delta doping layer comprising a dopant selected from the group consisting of carbon, silicon, germanium, tin, lead and combinations thereof, wherein said delta doping layer comprises an average layer thickness ranging from about 5 nanometers to about 15 nanometers, wherein said delta doping layer comprises said dopant at a concentration of at least $1 \times 10^{19}$ atoms per $cm^3$;
   growing a base region over said delta doping layer, said base region comprising an active junction, said base region comprising a first side and a second side opposed from said first side, wherein said first side of said base region directly contacts said delta doping layer;

growing an intrinsic region in direct contact with said second side of said base region; and growing an emitter region over said intrinsic region such that said intrinsic region is positioned between said base region and said emitter region.

18. The method of claim 17 further comprising providing a window over said emitter region such that said emitter region is positioned between said intrinsic region and said window.

19. A method for manufacturing a solar cell comprising the steps of growing a first back surface field layer on a substrate, said first back surface field layer comprising AlGaAs or AlGaInP;

delta doping said first back surface field layer to form a delta doping layer, said delta doping layer comprising a dopant selected from the group consisting of carbon, silicon, germanium, tin, lead and combinations thereof, wherein said delta doping layer comprises an average layer thickness ranging from about 5 nanometers to about 15 nanometers, wherein said delta doping layer comprises said dopant at a concentration of at least $1 \times 10^{19}$ atoms per cm$^3$;

growing a second back surface field layer over said delta doping layer such that said delta doping layer is positioned between and directly contacting said first back surface field layer and said second back surface field layer, said second back surface field layer comprising AlGaAs or AlGaInP;

growing a base region over said second back surface field layer, said base region comprising an active junction, said base region comprising a first side and a second side opposed from said first side, wherein said first side of said base region directly contacts said second back surface field layer;

growing an intrinsic region in direct contact with said second side of said base region; and growing an emitter region over said intrinsic region such that said intrinsic region is positioned between said base region and said emitter region.

20. The method of claim 19 further comprising providing a window over said emitter region such that said emitter region is positioned between said intrinsic region and said window.

* * * * *